United States Patent [19]

Penney

[11] 4,415,927
[45] Nov. 15, 1983

[54] CALIBRATION REFERENCE SIGNAL GENERATOR

[75] Inventor: Bruce J. Penney, Portland, Oreg.
[73] Assignee: Tektronix, Inc., Beaverton, Oreg.
[21] Appl. No.: 310,957
[22] Filed: Oct. 13, 1981
[51] Int. Cl.$^3$ ............................................. H04N 7/02
[52] U.S. Cl. ..................................... 358/139; 358/10; 324/76 R
[58] Field of Search ................ 358/10, 139; 324/76 R

[56] References Cited

U.S. PATENT DOCUMENTS 4,240,100 12/1980 Gorbold et al. ....................... 358/10

*Primary Examiner*—Richard Murray
*Attorney, Agent, or Firm*—John D. Winkelman; John Smith-Hill

[57] ABSTRACT

An improved calibration reference signal generator that includes both preset and variable means for generating digital signals corresponding to reference voltage levels. The digital signals are coupled through a chopper switch to a first DAC, which produces a square wave analog signal having an amplitude equal to the desired reference voltage. The digital signals also are coupled directly to a second DAC, which converts at least the most significant bit of the signals to a corresponding offset voltage. An output amplifier combines the square wave signal and offset voltage to produce an output square wave signal with a d.c. offset proportional to the amplitude of the square wave signal. In an alternative mode of operation, the output of the second DAC is disconnected from the output amplifier, which then produces a square wave signal without any offset.

8 Claims, 4 Drawing Figures

CALIBRATION REFERENCE SIGNAL GENERATOR

BACKGROUND OF THE INVENTION

The present invention relates to an electrical signal generator, and in particular to a high precision reference signal generator useful in measuring common video test signals and in calibrating video test signal generators and waveform monitors.

Video and other test signal generators are available from a variety of manufacturers. Before using such a generator to test or calibrate other devices, its output signal amplitude must be determined or set accurately. If the test signal generator produces sine waves or d.c. levels, amplitude measurements and adjustments can be carried out using conventional calibration instruments, such as precision digital voltmeters. When the generator output is a complex or composite signal having a plurality of critical amplitude levels (such as a television test signal), measuring or setting each level individually is a far more difficult and time-consuming task.

DESCRIPTION OF THE PRIOR ART

A conventional technique for individually adjusting or measuring the various amplitudes of a composite signal is to use a chopped reference voltage generator and an oscilloscope with a differential (A-B) input. An example of such a system is shown in FIG. 1. An oscilloscope 10, shown in simplified block diagram form, includes a first attenuator 12 and associated buffer amplifier 14 for input channel A, and a second attenuator 16 and associated buffer amplifier 18 for input channel B. Attenuators 12 and 16 suitably have the same attenuation ratio. The outputs of buffer amplifiers 14 and 18 are applied to the inputs of a differential amplifier 20, which is provided with control means 22 for adjusting its balance or offset level. The output signals from amplifier 20 are further amplified by a vertical amplifier 24 and applied to the vertical deflection plates of a cathode ray tube (CRT) 26. A trigger pulse generator circuit 28 is connected by a trigger source switch 30 to receive triggering signals either from amplifier 20 or from an external signal source. A sweep generator 32 connected to the output of pulse generator 28 produces ramp output signals that are amplified by a horizontal amplifier 34 and applied to the horizontal deflection plates of CRT 26.

A test signal generator 36 to be calibrated, which for purposes of this explanation is a television color test signal generator, is connected to supply a composite video signal to the channel A input of oscilloscope 10 and a horizontal sync signal to trigger circuit 28 via switch 30 as shown. A calibration reference signal generator 38 is connected to the oscilloscope's channel B input. Generator 38 includes a precision d.c. voltage source 40 and control means 42 for varying the output amplitude of source 40. Switching means 44 driven by a square wave generator 46 form a chopper that alternately applies the d.c. output from source 40 and a reference potential (ground) to the input of a buffer amplifier 48. Generator 38 thus produces a square wave amplitude reference signal having two accurate voltage levels: the output voltage of source 40 and ground. As is evident, the frequency, or repetition rate, of the reference signal is determined by square wave generator 46.

Referring now to FIG. 2 in conjunction with FIG. 1, test signal generator 36 will be assumed to produce a composite video signal 35 (FIG. 2A) that includes one or more chrominance (color) packets 37. The "porch" level 39 of the video signal is nominally at ground (0 volts) potential. The square wave output signal 45 (FIG. 2B) of calibration reference signal generator 38 is subtracted from the composite video signal by differential amplifier 20. As indicated in FIG. 2, the repetition rate of signal generator 38 is typically very low in comparison with the horizontal interval of the video signal, and the two generators (36 and 38) are not synchronized. The resultant oscilloscope display is shown in FIG. 2C, with the video test signal being displayed in both the upper and lower areas of the CRT screen. Although actually produced at different times, the upper and lower signal traces are displayed simultaneously because of the persistence of the phosphor forming the screen. Since the porch levels of the two video signal displays correspond to the two levels of calibration signal 45—i.e., ground and the d.c. output of source 40—the displayed signals can be moved vertically on the screen relative to each other by varying the output level of source 40. Thus, to measure the amplitude of a selected chrominance packet 37 in test signal 35, the d.c. level of source 40 is adjusted using control means 42 until the upper edge of packet 37 in the lower display coincides with the lower edge of the same packet in the upper display (as shown in FIG. 2D). The amplitude of packet 37 then is equal to the output voltage of source 40, which can be independently measured or read out from the setting of control means 42. Alternatively, to adjust the amplitude of a selected chrominance packet to a standard or desired value, reference signal generator 38 is set to provide square waves of the proper amplitude (using control means 42) and the gain of test signal generator 36 is then adjusted to match the edges of the selected packet in the same manner.

A similar measurement system is described in U.S. Pat. No. 3,534,155 of C. W. Rhodes, which is assigned to the assignee of the present invention. In the Rhodes system, the calibration reference signal is a precise d.c. potential rather than a square wave. Two displays of the test signal (one inverted, one non-inverted) are produced on the CRT screen by phase-switching the outputs of the oscilloscope's differential amplifier (i.e., amplifier 20). Measurements are made by moving the displays vertically on the screen to match corresponding selected portions, which is accomplished by varying the potential of the reference voltage with a calibrated potentiometer.

For increased precision in the above-described measurement or adjustment processes, the vertical gain of oscilloscope 10 may be increased by reducing the values of attenuators 12 and 16. However, when this is done, the edges of the selected chrominance packet may no longer be displayed on the CRT. If that is the case, control means 22 is used to adjust the offset or balance level of amplifier 20 to reposition the edges of the packet at screen center.

Both of the above systems can be used to measure or adjust complex or composite signal amplitudes accurately. However, the disadvantages of such systems are numerous. For example, if the gains of oscilloscope channels A and B are substantially increased to improve measurement precision, balance control 22 will need to be adjusted every time amplitude control 42 is changed. The inconvenience of this arrangement is obvious. Moreover, on most oscilloscopes and waveform monitors, the vertical frequency response varies as the vertical position control is moved between the top and bottom of its range. The ideal practice would be to leave the control in the same place for all signal parameter measurements, but this is not possible with prior art calibration/measurement systems of the type described above.

A general object of the present invention thus is to provide an improved calibration reference signal generator that minimizes or eliminates the above-mentioned and other disadvantages of prior art systems.

A more specific object is to provide an improved calibration reference signal generator that produces a square wave signal with a d.c. offset level that is varied automatically in accordance with the amplitude of the square wave signal.

A further object is to provide a calibration signal generator that is suitably programmed to produce specific standard test signal amplitudes as well as a variable amplitude calibration signal.

Still a further object is to provide a calibration signal generator capable of indicating directly the percentage of deviation of a measured test signal amplitude from the correct value.

Another object of the invention is to provide signal generator capable of producing calibration reference signals substantially faster than the television field rate to eliminate any perceived flicker in displays of combined calibration reference and test signals.

These and other desirable objects achieved by the present invention will become apparent as the following detailed description of a preferred embodiment thereof is read in conjunction with the accompanying drawing.

DETAILED DESCRIPTION OF PREFERRED EMBODIMENT

Figure 3:
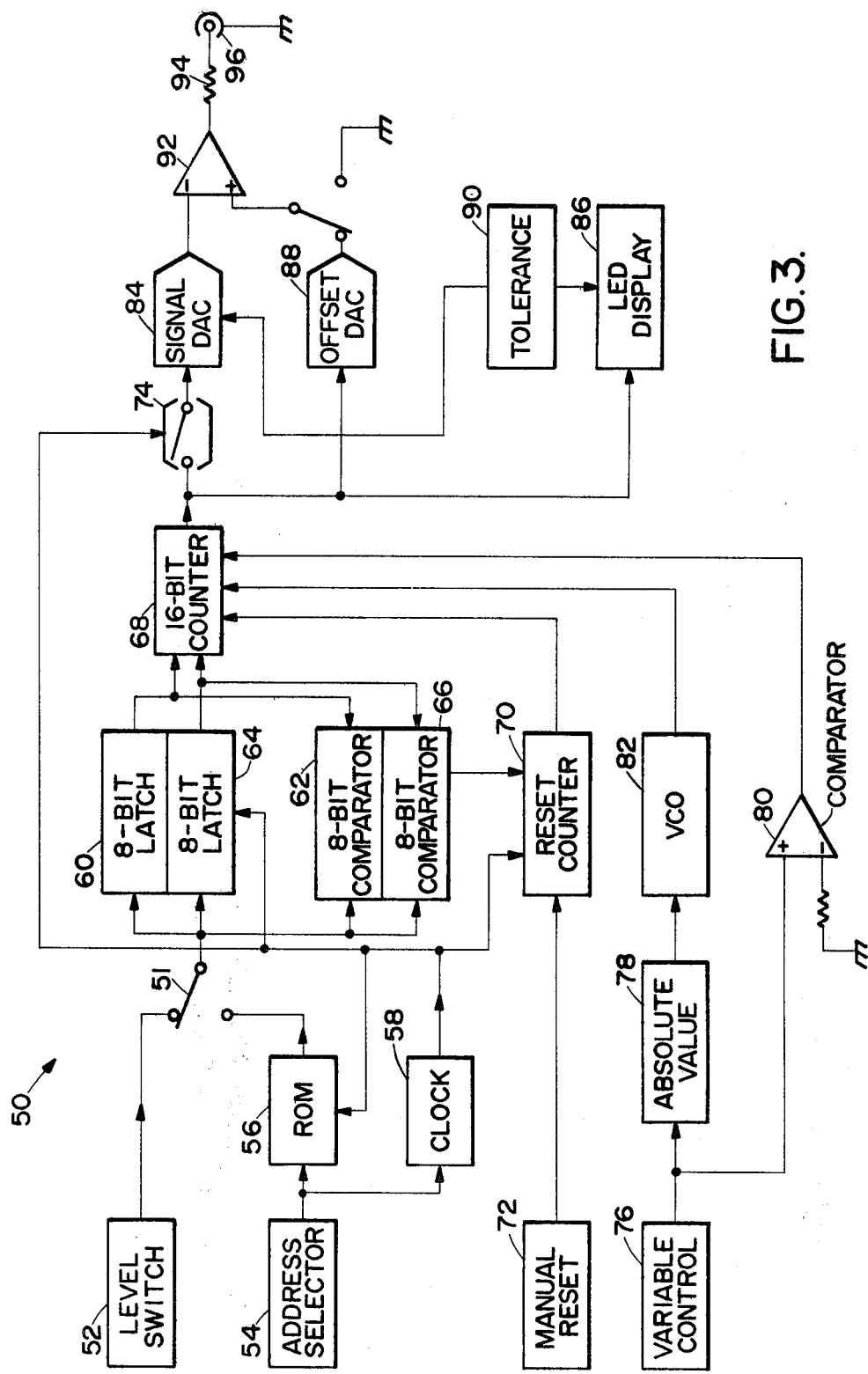
FIG. 3 is a block diagram of a calibration reference signal generator according to the present invention.

A calibration reference signal generator 50 in accordance with a preferred embodiment of the invention is shown in block diagram form in FIG. 3. Generator 50 has two primary modes for setting the amplitude of the unit's square wave output reference signal: PRESET and MANUAL. In the MANUAL mode, selected by moving SPDT switch 51 to the position shown, the output amplitude is set with a four-digit level switch 52. In the PRESET mode, an address selector 54, suitably an array of push button switches, selects the address of a read-only memory (ROM) device 56, such as a type 2716 device, and causes a clock generator 58 to produce a clock signal appropriate to a desired TV standard (NTSC, PAL, SECAM, etc.). The digital signal from ROM 56 is supplied to switch 51. Blocks 52, 54 and 56 constitute digital signal generator means for the generator. The higher 8 bits of the digital signal selected by switch 52 are supplied to an 8-bit latch circuit 60 and an 8 bit comparator 62; the lower 8 bits are supplied to an 8-bit latch circuit 64 and an 8-bit comparator 66. Latch circuits 60 and 64 may be type 74LS273 (2×8-bit), and comparators 62 and 56 may be type 74LS85 (4×4-Bit).

The 8-bit digital output signal from latch circuit 60 is supplied to comparator 62 and the data input terminals of a 16-bit up/down counter 68, such as a type 74LS190 (4×4-bit), and the 8-bit digital output signal from latch circuit 64 is supplied to comparator 66 and counter 68. The output signals from comparators 62 and 66 are supplied to reset counter 70, which is connected to a manual reset control 72. The output from counter 70 resets counter 68. The clock signal from clock generator 58 is supplied to ROM 56, latch circuits 60–64, reset counter 72, and the control terminal of a chopper 74.

Figure 1:
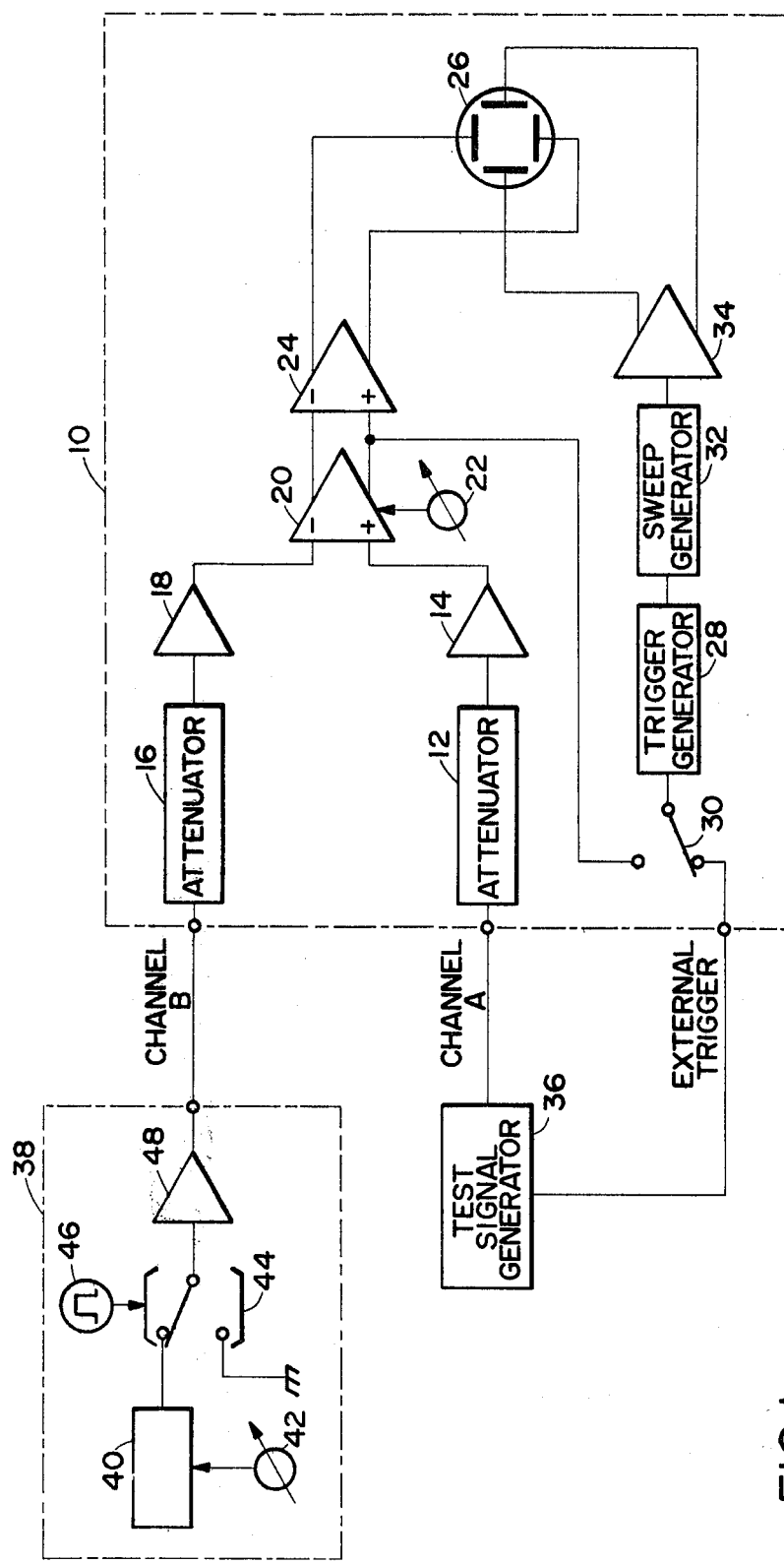
FIG. 1 is a block diagram of a prior art system for measuring or adjusting the amplitude of a composite signal component.
Figure 2A:
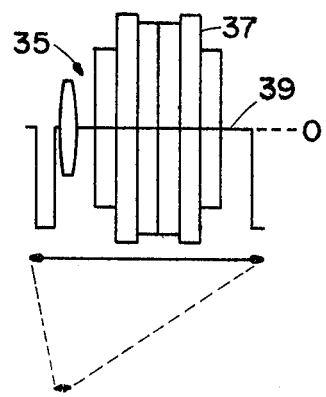
FIG. 2 depicts certain signal waveforms illustrating the operation of the FIG. 1 system.
Figure 2B:
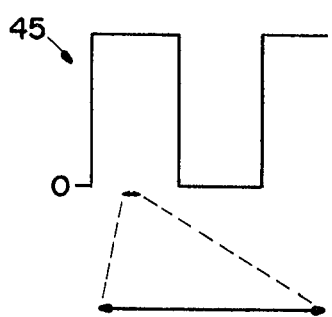
Figure 2C:
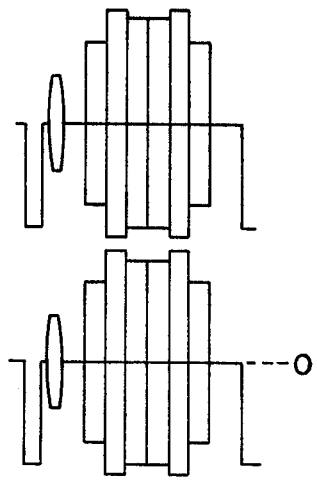
Figure 2D:
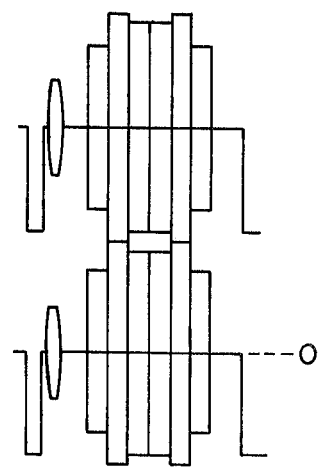

A VARIABLE output amplitude control 76 generates a positive or negative variable d.c. voltage to be supplied to an absolute value circuit 78 and a comparator, or polarity detector, 80. A voltage controlled oscillator (VCO) 82 generates a square wave, the frequency of which is controlled in accordance with the absolute value from circuit 78. The square wave from VCO 82 is supplied to the clock terminal of counter 68. The output from polarity detector 80 selects the counting direction (up or down) of counter 68. The 16-bit digital output signal from counter 68 is supplied to a signal digital-to-analog converter (DAC) 84, such as a type DAC 70CCDI, through chopper 74 and directly to a 4 digit LED readout circuit 86. At least the most significant bit (MSB) of the 16-bit digital signal, suitably the higher 12 bits, is supplied to an offset DAC 88, such as a type DAC 80CCDI. A tolerance circuit 90 controls the reference voltage of DAC 84. It is also connected to the LED display circuit. When the tolerance circuit is enabled, the display is made to flash on and off, indicating that the generator is in an uncalibrated mode. Switch 74 and DAC 84 constitute square wave generation means for the generator. The analog outputs from DACs 84 and 88 are supplied to an operational amplifier, or offset means, 92, and the output therefrom is supplied through a 37.5 ohm termination resistor 94 to an output terminal 96. To use the signal generator of FIG. 3 for adjusting or measuring the amplitude of the composite signal, output terminal 96 is connected to attenuator 16 (FIG. 1).

Operation of generator 50 is as follows. To adjust the amplitude of a selected component of a composite test signal, switch 51 is used to select either level switch 52 (MANUAL mode) or ROM 56 (PRESET mode). Assuming the MANUAL mode is selected, the operator sets the level switch to a selected value. Comparators 62–66 compare the switch settings with data (a parallel 16-bit digital signal) previously stored in latch circuits 60–64, and store any new data in the latch circuits. If the switch settings are different from the old data, counter 70 resets counter 68, and the new data in latch circuits 60–64 is stored in counter 68 and appears at the output terminal of the counter. In other words, counter 68 operates as a latch circuit to transfer the data at the input terminals to the output terminal. If the switch settings are the same as the old data, counter 68 is not reset. It should be noted that manual reset control 72 can be used to reset counter 68 via counter 70.

The output data from counter 68 is chopped by switch 74 in accordance with the signal from clock 58. Signal DAC 84 thus generates a d.c. level corresponding to the data set by 4 digit level switch 52 when switch 74 is "on", and a reference level, such as ground, when switch 74 is "off". Readout circuit 86 displays the value set by level switch 52. Offset DAC 88 converts at least the MSB (higher 12 bits in this embodiment) of the data from counter 68 to an analog voltage. Amplifier 92 combines the square wave signal produced by DAC 84 and the d.c. offset voltage from DAC 88, so that the output from amplifier 92 is an offset square wave voltage, the amplitude of which corresponds to the setting of level switch 52. The offset level is automatically controlled in accordance with the square wave amplitude. Therefore, if the digital data from counter 68 is changed using level switch 52, the offset level at output terminal 96 is adjusted automatically, and it is not necessary to adjust controller 22 (FIG. 1). The edges of the selected component thus are displayed substantially in the center area of CRT 34 regardless of the setting of level switch 50.

When tolerance circuit 90 is used to the reference level of DAC 84, the output from DAC 84 is uncalibrated and readout circuit 86 indicates this condition by flashing the display.

When ROM 56 is selected by switch 51, the data selected by address selector 54 is supplied to latch circuits 60-64 and comparators 62-66, and the operation is similar to that described above. ROM 56 stores data representing the predetermined amplitudes of each component of a standard TV signal. For example, in an NTSC color signal, the chrominance components (75% APL, 7.5% set up) are as follows: yellow=445.1 mV, cyan=625.9 mV, green=588.3 mV, magenta=588.3 mV, red=625.9 mV, and blue=445.1 mV. Digital data corresponding to these standard levels are stored in ROM 56, and the operator may select any of them by pushing the appropriate switch. This memory system is very useful for adjusting video standard test signals.

To measure the amplitude of a selected component of a composite signal, the operator adjusts VARIABLE output amplitude control 76 by observing CRT 36. Since counter 68 counts the output pulses from VCO 82 at a speed corresponding to the absolute value of the output from control 76, and the counting direction is controlled by the output from polarity detector 80, the operator merely adjusts control 76 to match the edges of the upper and lower displays of the selected component on CRT 34. When these edges concide, VARIABLE control 76 is set to zero volts and the amplitude of the selected component is displayed on 4 digit LED readout circuit 86. Of course, it is not necessary to adjust controller 22 for the offset level of oscilloscope 10 even if control 76 is set to a different level, because the higher 12 bits of the data from counter 68 are used as the offset level, which is automatically controlled in accordance with the amplitude of the square wave voltage from signal DAC 84.

Figure 4:
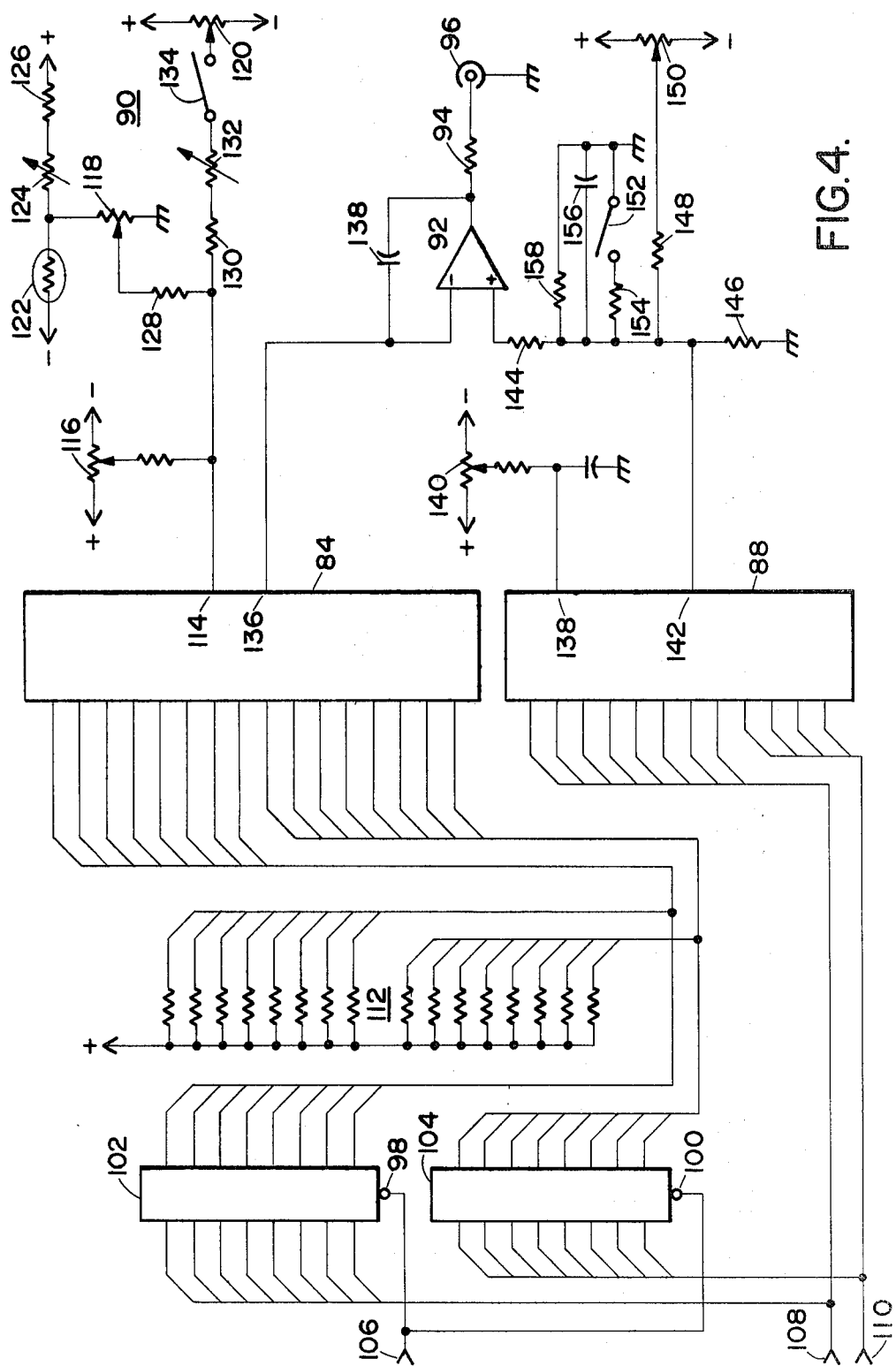
FIG. 4 is a schematic diagram of a selected portion of the FIG. 3 generator.

Referring now to FIG. 4, a circuit diagram of one portion of FIG. 3, the enable terminals 98 and 100 of buffer and driver circuits 102, 104 receive a clock signal from clock generator 58 (FIG. 3) through terminal 106. The data input terminals of buffers 102 and 104 receive the higher and lower 8 bits from 16-bit counter 68 through terminals 108 and 110. Buffers 102 and 104 suitably are type 74LS244 devices. The data output terminals of buffers 102 and 104 are connected to a positive voltage source through a resistor network 112 and the digital input terminals of signal DAC 84. The data input terminals of DAC 88 receive the 8 bits from terminal 108 and the higher 4 bits of those at terminal 110. Reference terminal 114 of DAC 84 is connected to a gain control or potentiometer 116 and tolerance circuit 90 consisting of potentiometers 118-120, resistors 112-132, and a switch 134. In the calibrated condition, switch 134 is "off" (open) and resistors 116-124-132 are adjusted to supply a calibrated reference level to terminal 114 of DAC 84. If switch 134 is "on" (closed), the reference voltage of DAC 84 is controlled by potentiometer 120. Analog output terminal 136 of DAC 84 is connected to the inverting input terminal of amplifier 92, and phase compensation capacitor 138 is inserted between the inverting input terminal and the output terminal of amplifier 92. Output resistor 94 is chosen such that loading effects of the difference amplifier in oscilloscope 10 (FIG. 1) are corrected automatically, eliminating the need to terminate the reference signal generator.

The reference terminal of offset DAC 88 receives a calibrated reference level from a potentiometer 140. Analog output terminal 142 of DAC 88 is connected to the noninverting input terminal of amplifier 92 through resistor 144 and to circuit network 146-148-150-152-154-156-158. Potentiometer 150 controls the offset level and switch 152 changes the offset level.

Since buffers 102 and 104 include enable terminals 98 and 100, buffers 102 and 104 transfer the input data to signal DAC 84 only when the clock signal is low. In other words, buffers 102 and 104 operate as the chopper or switch 74 in FIG. 3. When buffers 102 and 104 are not enabled, a high logic level is supplied from the positive voltage source through resistor network 112 to DAC 84. DAC 84 operates in a negative logic manner, and all data inputs are logic "0", so that DAC 84 generates the ground level. Thus, DAC 84 generates a square wave determined by the input data and the ground level, and its frequency is determined by the clock signal. DAC 88 generates the offset level in accordance with the higher 12 bits of the input data to DAC 84, and amplifier 92 sums the outputs from DACs 84 and 88.

While the best mode presently contemplated for practicing the invention has been set forth, it will be appreciated that various changes and modifications are possible within the ambit of the above teachings. It is therefore to be understood that the true scope of the invention is limited only as required by the express terms of the appended claims.

I claim as my invention:

1. A signal generator, comprising
   means for generating amplitude data in the form of a multibit digital signal,
   means for generating a rectangular waveform signal having a reference level and a second level derived from said digital signal,
   means for converting at least the most significant bit of said digital signal to a corresponding analog signal, and
   means for offsetting said rectangular waveform signal an amount corresponding to the value of said analog signal.

2. Apparatus for calibrating a video test signal generator, comprising a signal generator according to claim 1, and a waveform monitor having first and second inputs and operable in a differential input mode, said signal generator having an output at which the offset rectangular waveform is provided and which is connected to said first input of the waveform monitor, so that when a test signal generated by the test signal generator is applied to the second input of the waveform monitor the waveform monitor provides a first display of the waveform of the test signal which is offset by an amount corresponding to the value of said analog signal and a second display of the waveform of the test signal which is spaced from the first display by an amount corresponding to the amplitude of said rectangular waveform signal.

3. A signal generator, comprising first means for generating multibit digital signals representing an amplitude level, second means for converting said digital signals to analog form, third means intermediate said first and second means for periodically interrupting said digital signals, and fourth means coupled to receive an analog signal from said second means and produce a rectangular waveform output signal having a reference level and a second level corresponding to the magnitude of said analog signal.

4. The signal generator of claim 3, wherein said first means includes an addressable digital signal memory containing amplitude level-encoded signals and addressing means for selectively recalling said signals from said memory.

5. The signal generator of claim 4, wherein said encoded signals represent standard video test signal amplitudes.

6. The signal generator of claim 3, further including fifth means for converting at least the most significant bit of said digital signals to an equivalent analog signal, and for offsetting said rectangular waveform signal an amount corresponding to the magnitude of said equivalent signal.

7. The signal generator of claim 3, further including display means coupled to said first means for indicating said amplitude level.

8. The signal generator of claim 3, further including means for selectively changing the multibit signals generated by said first means to vary the amplitude of said rectangular waveform output signal.

* * * * *